United States Patent [19]

Uehara et al.

[11] Patent Number: 5,281,794
[45] Date of Patent: Jan. 25, 1994

[54] HEATER BLOCK FOR USE IN A BONDER UTILIZING VACUUM SUCTION ATTACHMENT MEANS

[75] Inventors: Kouichi Uehara; Takashi Takeuchi, both of Tokyo, Japan

[73] Assignee: Kabushiki Kaisha Shinkawa, Tokyo, Japan

[21] Appl. No.: 939,032

[22] Filed: Sep. 2, 1992

Related U.S. Application Data

[63] Continuation of Ser. No. 705,285, May 24, 1991, abandoned.

[30] Foreign Application Priority Data

May 25, 1990 [JP] Japan .................................. 2-135791

[51] Int. Cl.⁵ .............................................. H01L 21/60
[52] U.S. Cl. .................................. 219/243; 219/526; 156/583.1; 269/21; 279/3
[58] Field of Search ................ 219/243, 221, 526; 156/579-583.2, 583.4; 279/3; 269/21; 228/44.7; 294/64.1, 65

[56] References Cited

U.S. PATENT DOCUMENTS

| | | | |
|---|---|---|---|
| 2,723,775 | 11/1955 | Von Hofe et al. | 269/21 |
| 3,272,611 | 9/1966 | Jorgensen | 279/3 |
| 3,355,078 | 11/1967 | Smith | 269/21 |
| 3,573,140 | 3/1971 | Griffith et al. | 156/583.1 |
| 3,617,045 | 11/1971 | Da Costa et al. | 279/3 |
| 4,002,046 | 1/1977 | Jamin | 269/21 |
| 4,790,897 | 12/1988 | Long | 269/21 |

FOREIGN PATENT DOCUMENTS 60-97633  5/1985  Japan .
1-93134  4/1989  Japan .

*Primary Examiner*—Bruce A. Reynolds
*Assistant Examiner*—John A. Jeffery
*Attorney, Agent, or Firm*—Koda and Androlia

[57] ABSTRACT

A heater block for bonders used in a semiconductor assembly line uses a vacuum suction force to securely hold the heater plate on the heater block via vacuum passages and vacuum adhesion holes connected to a vacuum pump so that an attachment and removal of the heater plate is accomplished easily and in a short span of time by merely turning on and off the vacuum suction adhesion force.

1 Claim, 3 Drawing Sheets

HEATER BLOCK FOR USE IN A BONDER UTILIZING VACUUM SUCTION ATTACHMENT MEANS

This is a continuation of application Ser. No. 705,285, filed May 24, 1991, now abandoned.

BACKGROUND OF THE INVENTION

1. Field of the Invention

The present invention relates to a heater block used in semiconductor manufacturing devices such as wire bonders, etc.

2. Prior Art

A conventional heater block in wire bonding machines selectively uses a multiple number of heater plates. When there is a change in the type of lead frames upon which bonding is to be performed, one of the heater plates which most matches the lead frames is selected and installed on a heater block body which contains a heater.

Japanese Utility Model Application Publication ("Kokoku") Nos. 1-42352 (called "Example 1") and 57-54278 (called "Example 2") disclose heater blocks having the structure described above. Example 1 uses two pins for horizontal positioning of the heater plate on the heater block body. In Example 2, the heater plate is fastened to the heater block body via screws.

These conventional examples have several problems. In Example 1, since the heater plate is merely placed at a specified position on the heater block body, the heater plate may float upwardly with respect to the heater block body. Thus, the bonding reliability tends to be low.

Contrarily, in Example 2, the heater plate is installed to the heater block body via screws. Accordingly, the heater plate is tightly fastened to the heater block body, and there are no such problems as seen in Example 1. However, since such a fastening in Example 2 is accomplished by means of screws, replacement of the heater plate requires a considerable amount of time.

SUMMARY OF THE INVENTION

Accordingly, the object of the present invention is to provide a heater block for use, for example, in a bonder, in which replacement of heater plate is accomplished very easily.

The object of the present invention is accomplished by a unique structure in a heater block used in a bonder wherein a heater plate is positioned and mounted on a heater block body in place by a vacuum suction adhesion means.

When the heater plate is positioned on the heater block body and the vacuum suction adhesion means is switched on, the heater plate is securely held on the heater block body by suction. In order to remove the heater plate, it is merely necessary to switch off the vacuum suction adhesion means.

Thus, since the attachment and removal of the heater plate is accomplished by switching the vacuum suction adhesion means on or off, replacement of the heater plate is very easy and is done in a short period of time.

DETAILED DESCRIPTION OF THE INVENTION

Figure 1:
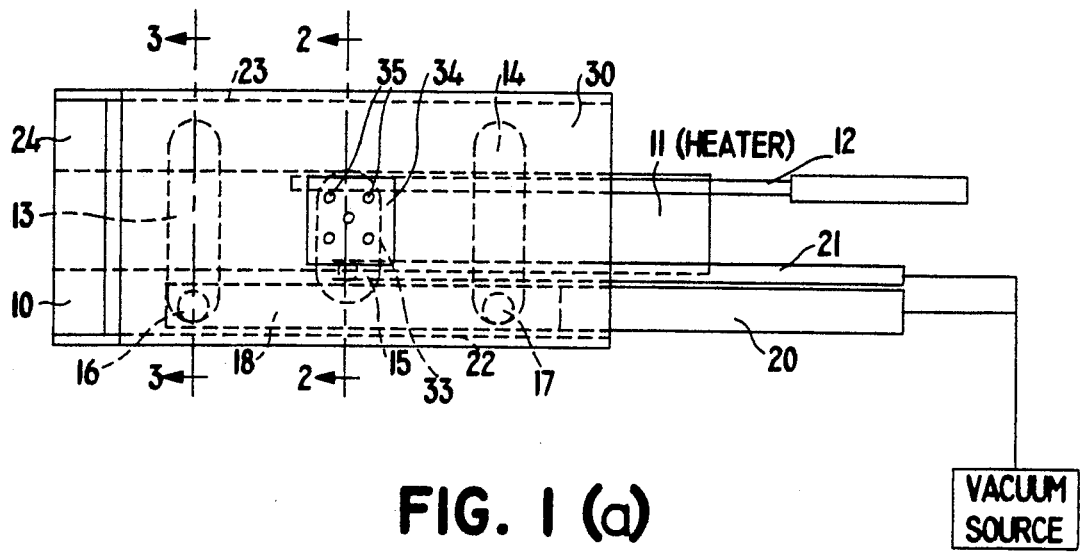
FIG. 1(a) is a top plan view of one embodiment of the present invention.
FIG. 1(b) is a front view thereof.
Figure 1:
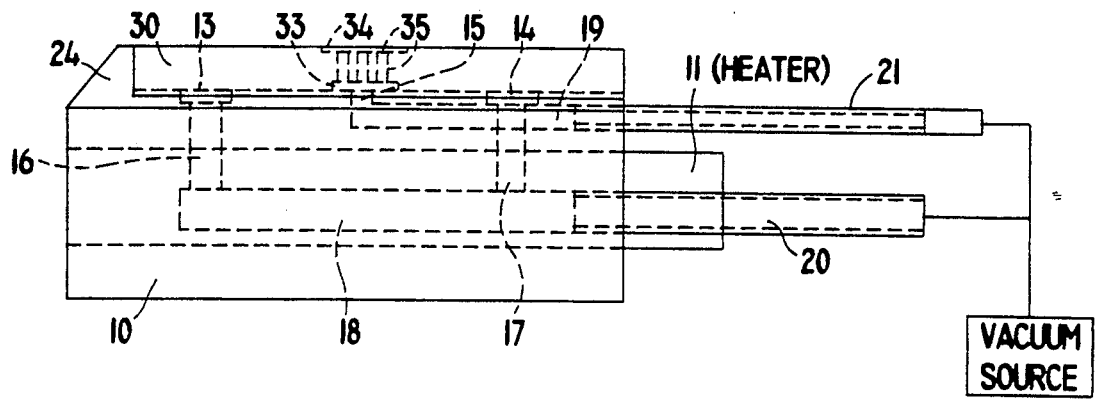
Figure 2:
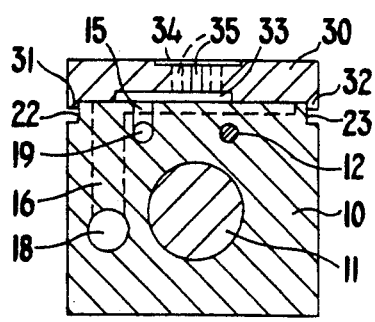
FIG. 2 is a cross section taken along the line 2—2 in FIG. 1(a)
Figure 3:
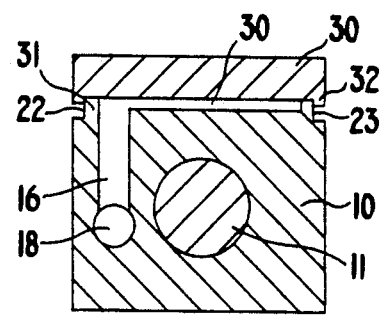
FIG. 3 is a cross section taken along the line 3—3 in FIG. 1(a)

One embodiment of the present invention will be first described with reference to FIGS. 1 through 3.

A heater 11 and a CA wire 12 (which is for temperature measurement) are provided in a heater block body 10. Two heater plate suction adhesion grooves 13 and 14 which hold heater plate 30 in place are formed in the top surface of the heater block body 10.

A suction adhesion hole 15 which holds an island part of a lead frame (not shown) in place by suction adhesion is opened on the upper surface of the heater block body 10. Reference numeral 16 and 17 are suction adhesion holes formed vertically in the suction adhesion grooves 13 and 14. These suction adhesion holes 16 and 17 communicate with a first horizontal vacuum passage 18, and the suction adhesion hole 15 communicates with a second horizontal vacuum passage 19. The vacuum passages 18 and 19 are connected to pipes 20 and 21, respectively, which are provided on one side surface of the heater block body 10 and connected to a vacuum pump (not shown) via electromagnetic valves (not shown).

Reference numerals 22 and 23 are positioning surfaces which set the position of the heater plate 30 in the X direction. These positioning surfaces 22 and 23 are formed on two side surfaces of the heater block body 10. A positioning ridge 24 which projects upward so as to set the position of the heater plate 30 in the Y direction is formed at one end of the top surface of the heater block body 10.

The heater plate 30 has positioning projections 31 and 32 which are downwardly projected from both sides of the lower surface of the heater plate 30. These projections 31 and 32 set the position of the heater plate 30 in the X direction when they are fitted over the positioning surfaces 22 and 23 of the heater block body 10.

Furthermore, the heater plate 30 is provided with a suction adhesion port 33 which is used to hold the island part of the lead frame in place by suction adhesion. The suction adhesion port 33 is formed on the lower surface of the heater plate 30 at a position that corresponds to the suction adhesion hole 15 of the heater block body 10. A recess 34 which receives the island part of the lead frame is formed on the top surface of the heater plate 30 at a position that corresponds to the suction adhesion port 33. The suction adhesion port 33 and the recess 34 communicate with each other by a multiple number of through-holes 35.

In operation, first the inner surfaces of the positioning projections 31 and 32 of the heater plate 30 are fit over the positioning surfaces 22 and 23 of the heater block body 10, and one end surface of the heater plate 30 is brought into contact with the positioning ridge 24 of the heater block body 10. The heater plate 30 is thus set and positioned on the heater block body 10 in the X and Y directions.

Then, when vacuum is applied to the vacuum passages 18 and 19 via the vacuum pump (not shown) through the pipes 20 and 21, the heater plate 30 is held in place on the heater block body 10 by the suction adhesion force of the suction adhesion grooves 13 and 14. When it is necessary to replace the heater plate 30, the heater plate 30 is removed from the heater block body 10 after turning off the vacuum applied to the vacuum passages 18 and 19 and releasing the vacuum adhesion force. Thus, the heater plate 30 is easily replaced.

Since the attachment and removal of the heater plate 30 can be accomplished by turning on and off the vacuum applied to the suction grooves 13 and 14, replacement of the heater plate 30 is very easy and done in a short period of time.

Figure 6:
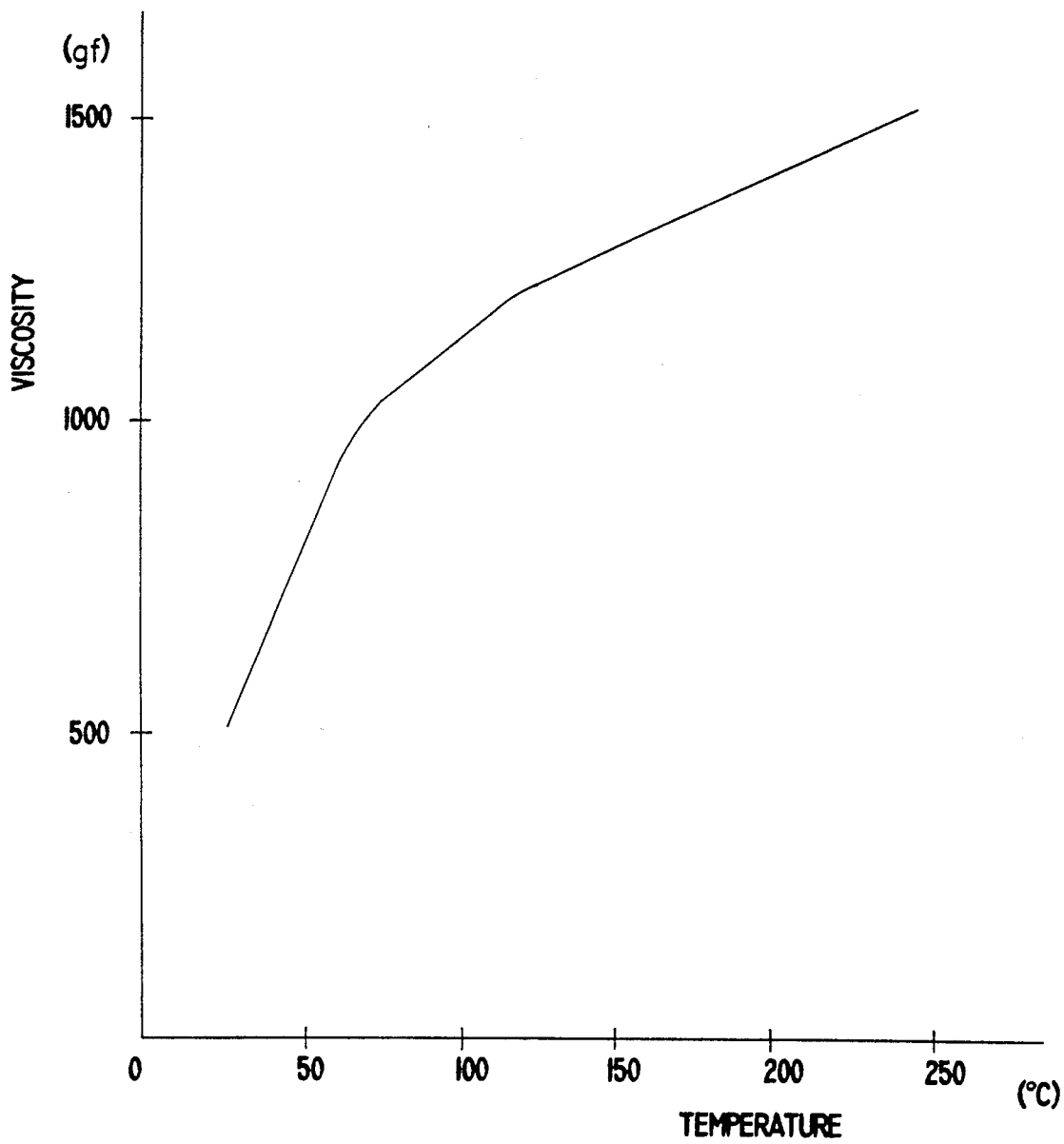
FIG. 6 is a graph showing the suction adhesion fastening strength of the heater plate when the heater block is heated by the heater.

Furthermore, experiments show that the strength of suction adhesion of the heater plate 30 increases as the temperature of the heater block body 10 rises. This is shown in the graph of FIG. 6. The reason for this is that air increases its viscosity when heated.

Accordingly, when a bonding is performed, a heater plate 30 (which is most matched with the lead frames to be processed) is mounted on the heater block body 10. Lead frames are fed at intervals, and when the island part of each lead frame is positioned in the recess 34, vacuum is applied to the vacuum passage 19, so that the island part is held in place in the recess 34 by suction adhesion via the suction adhesion port 33 and through-holes 35. After the completion of the bonding, the vacuum is cut off, and the lead frame thus processed is fed out of the recess 34.

In the embodiment described above, the positioning projections 31 and 32 are formed on the heater plate 30. Instead, these projections can be formed on the heater block body 10 so that the projections fit over the both side surfaces of the heater plate 30.

Figure 4:
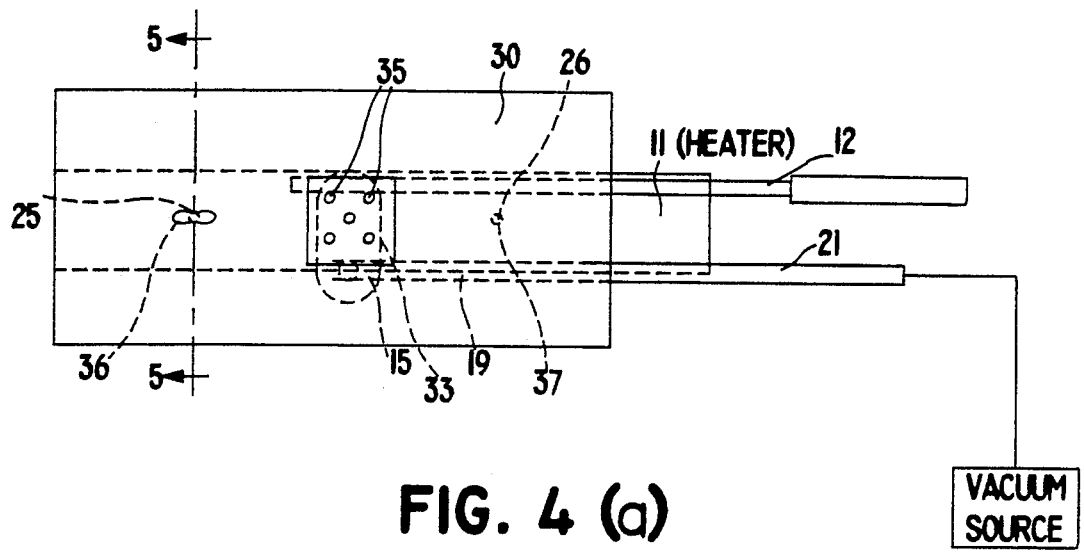
FIG. 4(a) is a top plan view of another embodiment of the present invention.
FIG. 4(b) is a front view thereof.
Figure 4:
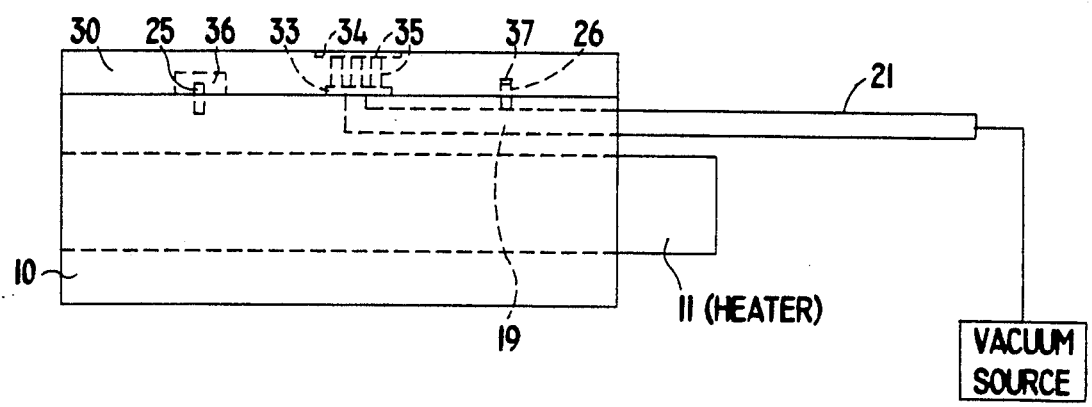
Figure 5:
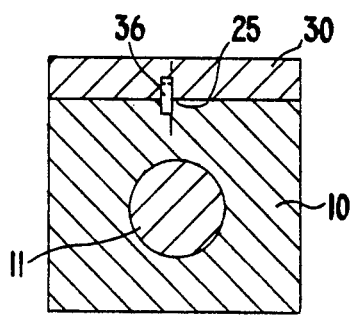
FIG. 5 is a cross section taken along the line 5—5 in FIG. 4.

FIGS. 4 and 5 illustrate another embodiment of the present invention. In this embodiment, the structure that holds the heater plate 30 to the heater block body 10 by vacuum suction adhesion is the same as in the previous embodiment, but the structure which positions the heater plate 30 on the heater block body 10 is different.

In the previous embodiment, positioning is accomplished via a plurality of surfaces of the positioning projections 31 and 32 and the positioning ridge 24 of the heater block body 10 as well as one side surface of the heater plate 30. In the embodiment shown in FIGS. 4 and 5, positioning is accomplished by an engagement of pins and holes as in the case of Example 1 described in the "Prior Art" section above.

More specifically, two pins 25 and 26 are installed uprightly on the heater block body 10. A slot 36, which loosely fits over the pin 25 with a space left in the length-wise direction of the heater plate 30, and a positioning hole 37, which snugly fits over the pin 26, are formed on the heater plate 30.

With these positioning pins 25 and 26 and holes 36 and 37, positioning of the heater block body 10 and the heater plate 30 is accomplished as is in the previous embodiment.

In the both embodiments described above, the island part of each lead frame is held in place by vacuum suction adhesion. However, in cases where there is no need to hold the island part in place by vacuum suction adhesion, the island part vacuum suction adhesion means (that consists of the vacuum suction adhesion hole 15 and vacuum passage 19 in the heater block body 10; and the pipe 21, the suction adhesion port 33 and through-holes 35 in the heater plate 30) is unnecessary. In this case, only the heater plate vacuum suction adhesion means (that consists of the suction adhesion grooves 13 and 14, the suction adhesion holes 16 and 17, the vacuum passages 18 and the pipe 20 in the heater block body) is necessary to hold the heater plate 30 in place.

The above described island part vacuum suction adhesion means (that consists of the vacuum suction adhesion hole 15 and vacuum passage 19 in the heater block body 10; and the pipe 21, the suction adhesion port 33 and through-holes 35 in the heater plate 30) functions also to pull the heater plate 30 towards the heater block body 10 as a result of the vacuum suction adhesion applied to the lead frame. Accordingly, in cases where the island part of the lead frame is held in place by vacuum suction adhesion, it is conversely possible to install only the island part vacuum suction adhesion means (that consists of the vacuum suction adhesion hole 15 and vacuum passage 19 in the heater block body 10; and the pipe 21, the suction adhesion port 33 and through-holes 35 in the heater plate 30).

In this case, the heater plate vacuum suction adhesion means (that consists of the suction adhesion grooves 13 and 14, the suction adhesion holes 16 and 17, the vacuum passages 18 and the pipe 20 in the heater block body) can be omitted. When this structure is taken, the effect obtained is superior to that obtained in the cases where positioning is accomplished via the pins and holes alone as in Example 1.

However, when the lead frame is moved, the vacuum applied to the vacuum passage 19 in the heater block body 10 must be turned off each time. Accordingly, there is a danger that the heater plate 30 on the heater block body 10 becomes loose. Thus, such a structure is inferior to the structure in which the heater plate vacuum suction adhesion means (that consists of the suction adhesion grooves 13 and 14, the suction adhesion holes 16 and 17, the vacuum passages 18 and the pipe 20 in the heater block body) is used as shown in the Figures.

In the present invention, as is clear from the above description, the heater plate is held in place on the heater block body by a vacuum suction adhesion means. Accordingly, replacement of the heater plate is accomplished very easily.

We claim:

1. A lead frame bonding machine having a heater block, said heater block comprising a heater block body and a heater plate detachably mounted on said heater block body, and wherein said heater block body comprises:

a heating element and a temperature measuring means provided within said heater block;

at least two elongated heater plate adhesion grooves extending in an X-direction and a lead frame adhesion hole both formed on a top surface of said heater block, said at least two adhesion grooves and adhesion hole being communicated with a vacuum pump via vacuum passages formed inside said heater block body, said at least two heater plate adhesion grooves being parallel and spaced apart with said lead frame adhesion hole provided therebetween; and X-direction positioning surfaces formed on upper ends of both side surfaces of said heater block and a Y-direction positioning ridge projected at one end of said top surface of said heater block; and
said heater plate comprises:
a recess formed on the top surface and a suction port provided on the under surface, said recess of suction port being communicated with each other via a plurality of through holes, said suction port being provided in said heater plate such that it corresponds to said lead frame adhesion hole; and
positioning projections projecting downwardly from both side surfaces;
whereby said heater plate is placed on said top surface of said heater block with the positioning projections engaged with said X-direction positioning surfaces of said heater block body and one end engaged with said Y-direction positioning ridge of said heater block body, respectively, so that said heater plate is held on said heater block body by vacuum adhesion force provided by said vacuum pump.

* * * * *